United States Patent [19]

Uenishi et al.

[11] Patent Number: 4,871,645
[45] Date of Patent: Oct. 3, 1989

[54] POSITIVE-WORKING PHOTORESIST COMPOSITION

[75] Inventors: Kazuya Uenishi; Tadayoshi Kokubo; Yasumasa Kawabe, all of Shizuoka, Japan

[73] Assignee: Fuji Photo Film Co., Ltd., Kanagawa, Japan

[21] Appl. No.: 202,780

[22] Filed: Jun. 6, 1988

[30] Foreign Application Priority Data

Jun. 5, 1987 [JP] Japan ................ 62-141115

[51] Int. Cl.$^4$ ............................ G03C 5/24
[52] U.S. Cl. ................................ 430/192; 430/193; 430/270; 430/326; 522/36; 522/166
[58] Field of Search ............... 430/192, 193, 270, 326; 522/36, 166

[56] References Cited

U.S. PATENT DOCUMENTS

| | | | |
|---|---|---|---|
| 3,732,836 | 3/1988 | Potvin et al. | 430/193 |
| 3,732,837 | 3/1988 | Potvin et al. | 430/326 |
| 4,551,409 | 11/1985 | Gulla et al. | 430/326 |
| 4,564,575 | 1/1986 | Perreault et al. | 430/326 |
| 4,588,670 | 5/1986 | Kelly et al. | 430/328 |
| 4,650,745 | 3/1987 | Eicbeck | 430/326 |
| 4,806,453 | 2/1989 | Vincgek et al. | 430/326 |

Primary Examiner—Jack P. Brammer
Attorney, Agent, or Firm—Sughrue, Mion, Zinn, Macpeak & Seas

[57] ABSTRACT

A positive-working photoresist composition is disclosed. The composition comprises a light-sensitive compound represented by general formula (A) and an alkali-soluble novolak resin.

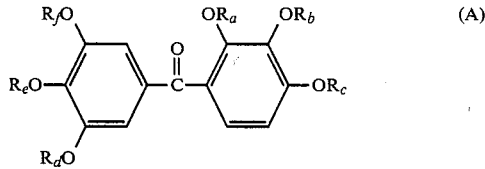

wherein $R_a$, $R_b$, $R_c$, $R_d$, $R_e$ and $R_f$, which may be the same or different, each represents H, —X—$R_1$,

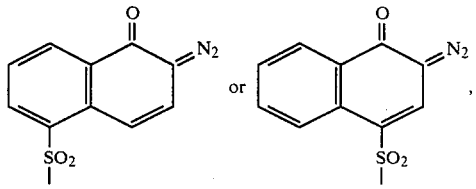

provided that among the six substituents represented by $R_a$ to $R_f$, the number of the substituents representing H is a real number of more than 0 and not more than 3 calculated in terms of average value per molecule of the light-sensitive compound, the number of the substituents representing —X—$R_1$ is a real number of not less than 0.3 calculated in terms of average value per molecule of the light-sensitive compound, and the number of the substituents representing

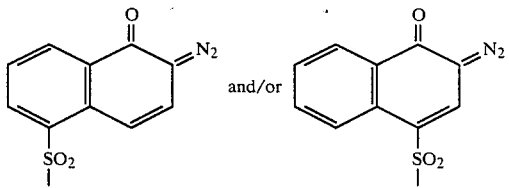

is a real number of not less than 2.5 caluclated in terms of average value per molecule of the light-sensitive compound; X represents a simple bond,

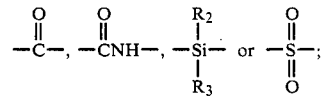

$R_1$ represents a substituted or unsubstituted aliphatic group or a substituted or unsubstituted aromatic group; and $R_2$ and $R_3$, which may be the same or different, each represents H or a substituted or unsubstituted aliphatic group or a substituted or unsubstituted aromatic group.

The positive-working photoresist composition is excellent in resolving power, speed, resist profile and heat resistance and is particularly suitable for forming a pattern of fine structure.

12 Claims, No Drawings

POSITIVE-WORKING PHOTORESIST COMPOSITION

FIELD OF THE INVENTION

The present invention relates to a positive-working photoresist composition capable of responding to radiation and, more particularly, to a photoresist composition which has high resolving power, high speed, provides a good profile of cross section, and is suitable for working a pattern of fine structure.

BACKGROUND OF THE INVENTION

Positive-working photoresist compositions generally comprise a composition containing an alkali-soluble resin and a light-sensitive substance based on a naphthoquinonediazide compound. For example, U.S. Pat. Nos. 3,666,473, 4,1115,128, 4,173,470, etc., describe "novolak type phenolic resin/substituted naphthoquinonediazide compound", and L. F. Thompson, *Introduction to Microlithography* (ACS, No. 219, pp. 112-121) describes an example of a "novolak resin composed of cresol-formaldehyde/1,1-naphthoquinonediazidesulfonate of trihydroxybenzophenone" as the most typical composition.

Novolak resins used as binders are particularly useful in this environment, since they can be dissolved in an alkaline aqueous solution without swelling and, when a resulting image is used as a mask for an etching process, they provide a high resistance particularly against plasma etching. Naphthoquinonediazide compounds used as light-sensitive substances, which themselves function as a dissolution-preventing agent to reduce alkali solubility of the novolak resin, are peculiar in that, when decomposed by irradiation with light, they produce an alkali-soluble substance which increases the alkali solubility of the novolak resin. Naphthoquinonediazide compounds are particularly useful as light-sensitive substances for a positive-working photoresist due to this significant change in properties caused by light irradiation.

Many positive-working photoresists containing a novolak resin and a naphthoquinonediazide light-sensitive substance have been developed and put into practice in view of the above properties, and sufficient results have been obtained in working with a line width of about 1.5 μm to 2 μm.

However, due to the progressively increasing degree of integration of IC circuits, particularly in the manufacture of semiconductor bases for super-LSI, etc., working of superfine patterns having line widths of not more than 1 μm have been required. In such uses, photoresists having high resolving power, high pattern-reproducing accuracy capable of accurately reproducing an exposure mask image, and high speed in view of high productivity have been required. However, the above-described conventional positive-working photoresists fail to meet these requirements.

SUMMARY OF THE INVENTION

Therefore, an object of the present invention is to provide, particularly in the manufacture of semiconductor devices:

(1) a positive-working photoresist composition having high resolving power;

(2) a positive-working photoresist composition capable of accurately reproducing mask dimensions over a wide range of photomask line widths;

(3) a positive-working photoresist composition capable of forming a resist pattern of line width of not more than about 1 μm with a cross section of a high aspect ratio;

(4) a positive-working photoresist composition capable of forming a pattern having a cross section with a nearly vertical side wall;

(5) a positive-working photoresist composition having a broad exposure and development latitude;

(6) a positive-working photoresist composition which is soluble in a conventional resist solvent having excellent storage stability, and which does not generate deleterious substances after a long-term storage; and (7) a positive-working photoresist composition capable of providing a resist image having excellent heat resistance.

The above and other objects and advantages of the present invention will become apparent from the following detailed description and examples.

That is, these objects can be attained by a positive-working photoresist composition comprising a light-sensitive compound represented by general formula (A) and an alkali-soluble novolak resin:

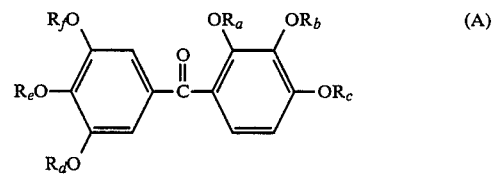

wherein $R_a$, $R_b$, $R_c$, $R_d$, $R_e$ and $R_f$, which may be the same or different, each represents H, —X—$R_1$,

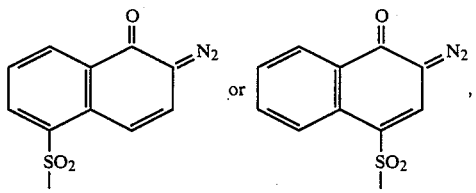

provided that among the six substituents represented by $R_a$ to $R_f$, the number of said substituents representing H is a real number of more than 0 and not more than 3 calculated in terms of average value per molecule of said light-sensitive compound, the number of said substituents representing —X—$R_1$ is a real number of not less than 0.3 calculated in terms of average value per molecule of said light-sensitive compound, and the number of said substituents representing

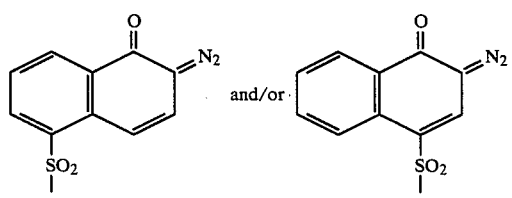

is a real number of not less than 2.5 calculated in terms of average value per molecule of said light-sensitive compound; X represents a simple bond,

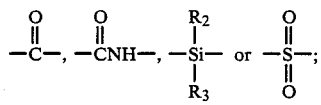

$R_1$ represents a substituted or unsubstituted aliphatic group or a substituted or unsubstituted aromatic group; and $R_2$ and $R_3$, which may be the same or different, each represents H or a substituted or unsubstituted aliphatic group or a substituted or unsubstituted aromatic group.

DETAILED DESCRIPTION OF THE INVENTION

According to a preferred embodiment of the present invention, among the six substituents represented by $R_a$ to $R_f$ in general formula (A) defined above, the groups shown in parentheses ( ) below are present in the light-sensitive compound in amounts as represented by real numbers calculated in terms of average value per molecule in the ranges shown below, respectively:

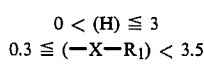

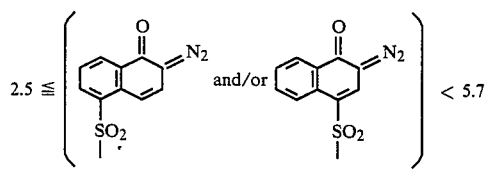

When the average value per molecule for exceeds 3, for $(-X-R_1)$ is not less than 3.5, or for

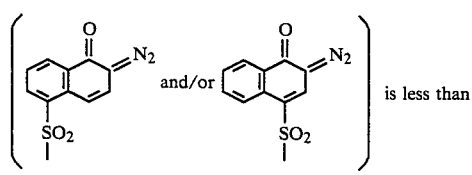

is less than 2.5, the resolving power of the photoresist composition containing the light-sensitive compound may deteriorate, in some instances. However, even when the broader ranges (defined above in the Summary of the Invention) are per molecule for these substituents, a photoresist composition within the scope of the present invention will still result. These narrower ranges are only intended to define preferred embodiments for the light-sensitive compound, and are not to be construed as limiting the present invention. Further, when the average value per molecule for $(-X-R)$ is less than 0.3 or when the average value per molecule for

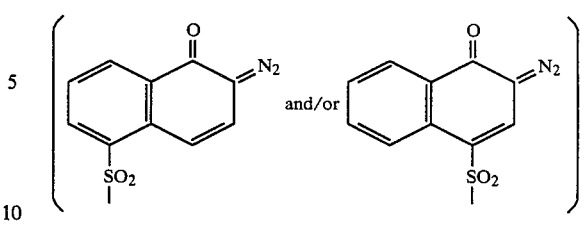

is not less than 5.7, solubility of the light-sensitive compound in a resist solvent may decrease, in some instances.

The group of $-X-R_1$ in general formula (A) represents a substituted or unsubstituted aliphatic group, a substituted or unsubstituted aromatic group, an acyl group represented by

(wherein $R_{11}$ represents a substituted or unsubstituted aliphatic group or a substituted or unsubstituted aromatic group), a silyl group represented by

(wherein $R_{12}$ and $R_{13}$, which may be the same or different, each represents a hydrogen atom, a substituted or unsubstituted aliphatic group or a substituted or unsubstituted aromatic group; and $R_{14}$ represents a substituted or unsubstituted aliphatic group or a substituted or unsubstituted aromatic group), a sulfonyl group represented by $-SO_2-R_{15}$ (wherein $R_{15}$ represents a substituted or unsubstituted aliphatic group or a substituted or unsubstituted aromatic group), or an amido group represented by

(wherein $R_{16}$ represents a substituted or unsubstituted aliphatic group or a substituted or unsubstituted aromatic group), etc.

The substituted or unsubstituted aliphatic group defined above for the various embodiments covered by $-X-R_1$ includes an alkyl group and an alkenyl group, etc. The substituted or unsubstituted aromatic group defined above for the various embodiments covered by $-X-R_1$ includes a phenyl group and a naphthyl group, etc.

Suitable substituents for the aliphatic group include, for example, an alkoxy group, an aryloxy group, an aryl group, a hydroxy group, a carboxy group, a sulfo group, an amino group, a nitro group, a silyl group, a silyl ether group, a cyano group, an aldehyde group, a mercapto group, and a halogen atom, etc.

Suitable substituents for the aromatic group include, for example, an aliphatic group in addition to the substituents for the aliphatic group described above.

The group of $-X-R_1$ in general formula (A) is selected from the groups as defined above, but preferably is selected from those groups wherein $R_1$ is a substituted or unsubstituted aliphatic group having from 1 to 8 carbon atoms or a substituted or unsubstituted aromatic group having from 6 to 15 carbon atoms.

The term "light-sensitive compound" as used herein sometimes means a mixture of light-sensitive compounds defined by formula (A) above which are the products of synthesis reactions described hereinafter, these compounds differing in their substituents as defined above.

The light-sensitive compound represented by the general formula (A) used in the photoresist composition of the present invention can be synthesized by modifying the hydroxy group of 2,3,4,3',4',5'-hexahydroxybenzophenone represented by the following formula (B):

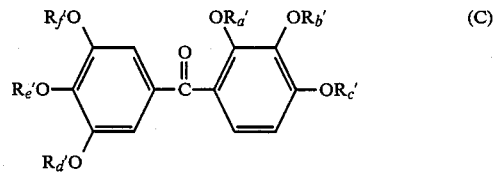

to form a compound represented by the following general formula (C):

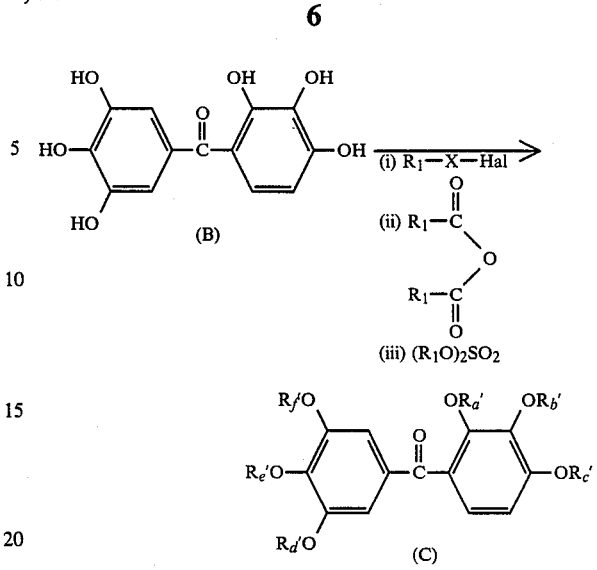

wherein $R_a'$, $R_b'$, $R_c'$, $R_d'$, $R_e'$, and $R_f'$, which may be the same or different, each represents H Or —X—$R_1$, provided that among the six substituents represented by $R_a'$ to $R_f'$, the number of said substituents represented by H is a real number of more than 0 and not more than 3 calculated in terms of average value per molecule of compound (C), and the number of said substituents represented by —X—$R_1$ is a real number of not less than 0.3 and not more than 3.5 calculated in terms of average value per molecule of compound (C): and X and $R_1$ each has the same meaning as defined in general formula (A), followed by reacting the resulting compound of formula (C) with 1,2-naphthoquinone-diazide-5-sulfonyl chloride or 1,2-naphthoquinonediazide4-sulfonyl chloride or a mixture thereof.

2,3,4,3', 4',5'-Hexahydroxybenzophenone noted above and as represented by formula (B) can be synthesized according to the process of H. Bleuler et al. (J. Chem. Soc., Vol. 109, page 529 (1916)).

The intermediate compound represented by general formula (C) can be synthesized in the manner illustrated below.

wherein Hal represents a halogen atom; and $R_1$ and X each has the same meaning as defined in general formula (A).

The compounds represented by general formula (C) synthesized in the manner described above are actually a mixture of compounds of general formula (C) wherein each of the compounds may contain the groups represented by —X—$R_1$ in different numbers and at different positions. These compounds do not exhibit a single structure. Therefore, the desired effect on disturbing crystallization of the light-sensitive compound occurs and thus, the properties of improved solubility in a resist solvent and improved storage stability after a long-term storage are obtained.

The esterification reaction between the compound of general formula (C) and 1,2-naphthoquinonediazide-5-sulfonyl chloride or 1,2-naphthoquinonediazide-4-sulfonyl chloride is conducted in a conventional manner. More specifically, predetermined amounts of polyhydroxybenzophenone derivatives represented by general formula (C) and 1,2-naphthoquinonediazide-5-sulfonyl chloride or 1,2- naphthoquinonediazide-4-sulfonyl chloride, and a solvent such as dioxane, acetone or methyl ethyl ketone are placed in a flask, and a basic catalyst such as sodium hydroxide, sodium carbonate, sodium hydrogencarbonate, triethylamine, etc. is added dropwise thereto to conduct the condensation reaction. The thus-obtained product is washed with water, purified, and dried. The light-sensitive compounds represented by general formula (A) can be prepared in the above-described manner.

The alkali-soluble novolak resin used in the present invention can be obtained by addition condensation of a phenol with about 0.6 to about 1.0 mol of an aldehyde per mol of the phenol in the presence of an acid catalyst. Suitable phenols include phenol, o-cresol, m-cresol, p-cresol, xylenol, etc., which may be used alone or as a combination of two or more. The ratio of each component can be adjusted appropriately in a preferred range taking the properties required to be imparted to and/or the desired end use of the photoresist composition into consideration, according to principles well understood by one of ordinary skill in the art.

Suitable aldehydes include formaldehyde, paraformaldehyde, furfural, etc. The acid catalyst may be hydrochloric acid, sulfuric acid, formic acid, oxalic acid, acetic acid, etc. The thus-obtained novolak resin having a molecular weight of from about 1,000 to about 50,000 is alkali soluble.

A suitable ratio of the light-sensitive compound to the alkali-soluble novolak resin used in the present invention is about 5 to about 100 parts by weight, preferably 10 to 50 parts by weight, of the light-sensitive compound per 100 parts by weight of the novolak resin. If the amount of the light-sensitive compound is less than about 5 parts by weight, a seriously reduced film-remaining ratio results whereas, if more than about 100 parts by weight, a reduction in speed and solubility in solvents results.

Although the above-described light-sensitive compounds are mainly used in the photoresist composition of the present invention, conventional light-sensitive compounds such as esters between 2,3,4-trihydroxybenzophenone, 2,4,4'-trihydroxybenzophenone, 2,4,6-trihydroxybenzophenone, 2,3,4,4'-tetrahydroxybenzophenone or the like and 1,2-naphthoquinonediazide-4- and/or -5-sulfonyl chloride may also be co-present, if desired. In such cases, these conventional light-sensitive compounds may be present in amounts of not more than about 100 parts by weight, preferably not more than 30 parts by weight, per 100 parts by weight of the above-described light-sensitive compound (A).

The composition of the present invention may further contain a polyhydroxy compound for accelerating dissolution of the composition into a developer. Preferred examples of such polyhydroxy compounds include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensate resin, etc.

Suitable solvents for dissolving the light-sensitive compound according to the present invention and the alkali-soluble novolak resin include ketones (e.g., methyl ethyl ketone, cyclohexanone, etc.), alcohol ethers (e.g., ethylene glycol monomethyl ether, ethylene glycol monoethyl ether, etc.), ethers (e.g., dioxane, ethylene glycol dimethyl ether, etc.), Cellosolve esters (e.g., methyl Cellosolve acetate, ethyl Cellosolve acetate, etc.), fatty acid esters (e.g., butyl acetate, methyl lactate, ethyl lactate, etc.), halogenated hydrocarbons (e.g., 1,1,2-trichloroethylene, etc.), and highly polar solvents (e.g., dimethylacetamide, N-methylpyrrolidone, dimethylformamide, dimethyl sulfoxide, etc.). These solvents may be employed alone or in combination of two or more thereof.

The positive-working photoresist composition of the present invention may contain, if desired, dyes, plasticizers, adhesion aids, surfactants, etc. Specific examples thereof include dyes such as Methyl Violet, Crystal Violet, Malachite Green, etc., plasticizers such as stearic acid, acetal resin, phenoxy resin, alkyd resins, etc., adhesion aids such as hexamethyldisilazane, chloromethylsilane, etc., and surfactants such as nonylphenoxypoly(ethyleneoxy)ethanol, octylphenoxypoly(ethyleneoxy)ethanol, etc.

The photoresist composition according to the present invention can be prepared in a conventional manner by mixing a light-sensitive compound represented by formula (A), an alkali-soluble novolak resin, and, if desired, other component(s) as described above.

The above-described positive-working photoresist composition is coated on a base (e.g., silicon substratum with oxide) to be used for the manufacture of accurate IC elements using an appropriate coating means such as a spinner or a coater, exposed through a predetermined mask, then developed to obtain a good resist.

More specifically, the positive-working photoresist composition of the present invention can be coated in a thickness of from about 0.5 to about 3 $\mu$m on a semiconductor wafer or a support made of glass, ceramic, metal or the like using a spin-coating process or a roller-coating process. Then, the coated composition is dried by heating, exposed to ultraviolet rays or the like through an exposure mask to print thereon a circuit pattern or the like, then developed to obtain a positive image. A subsequent etching process using this positive image as a mask enables pattern-wise work on the underlying support to be conducted. Typical fields of use for the photoresist composition are wide-ranging, but include processes for manufacturing semiconductors such as IC circuits, processes for manufacturing circuit supports for liquid crystals, thermal heads, etc., and other photofabrication processes.

Suitable developers for the positive-working photoresist composition of the present invention include aqueous solutions of alkalis such as inorganic alkalis (e.g., sodium hydroxide, potassium hydroxide, sodium carbonate, sodium silicate, sodium metasilicate, aqueous ammonia, etc.), primary amines (e.g., ethylamine, n-propylamine, etc.), secondary amines (e.g., diethylamine, di-n-butylamine, etc.), tertiary amines (e.g., triethylamine, methyldiethylamine, etc.), alcoholamines (e.g., dimethylethanolamine, triethanolamine, etc.), quaternary ammonium salts (e.g., tetramethylammonium hydroxide, tetraethylammonium hydroxide, etc.), or cyclic amines (e.g., pyrrole, piperidine, etc.). Further, alcohols and surfactants may be added to the aqueous solution of the alkali developer described above in appropriate amounts.

The positive-working photoresist composition of the present invention exhibits excellent superior properties in comparison with other photoresist compositions as to resolving power, reproduction fidelity of mask patterns, cross sectional profiles of the resist image, exposed and development latitude, speed, and heat resistance. In addition, the positive working photoresist solution according to the present invention, when dissolved in a conventionally used solvent, has excellent long-term storage stability.

The present invention is now illustrated in greater detail with reference to the following examples which, however, are not to be construed as limiting the present invention in any way. Unless otherwise indicated, all parts, percents, ratios and the like are by weight.

EXAMPLES 1 to 4

(1) Synthesis of Light-Sensitive Compound (a)

20 g of 2,3,4,3',4',5'-hexahydroxybenzophenone, 30 g of potassium carbonate and 160 ml of dimethylformamide were placed in three-necked flask. 33 g of diethyl a sulfate was added dropwise thereto with stirring at room temperature, and the mixture was heated to 75° C. and reacted for 1 hour. After the completion of the reaction, the reaction mixture was poured into 800 ml of distilled water, the pH of the system was adjusted to 3.0 with 36% hydrochloric acid, and the mixture was stirred at 40° C. for 1 hour. The precipitate was collected by filtration, washed with distilled water and dried under a vacuum. As the result of NMR measurement of the product thus obtained, it was found that ethyl groups were introduced in an average amount of 2.3 per molecule of 2,3,4,3′,4′,5′-hexahydroxybenzophenone.

30 g of the product obtained by the above described reaction, 84.5 g of 1,2-naphthoquinonediazide-5-sulfonyl chloride, and 750 ml of acetone were placed in a three-necked flask and stirred to dissolve these materials uniformly. Then, a mixed solution of triethylamine/acetone (=31.8 g/150 ml) was gradually added dropwise thereto and the reaction was conducted for 3 hours at room temperature. After completion of the reaction, the contents were dropwise added to a 1% hydrochloric acid aqueous solution to obtain 1,2-naphthoquinonediazide-5-sulfonate of ethylated derivative of 2,3,4,3′,4′,5′-hexahydroxybenzophenone.

(2) Synthesis of Light-Sensitive Compound (b)

10 g of 2,3,4,3′,4′,5′-hexahydroxybenzophenone, 80 ml of dimethylformamide and 0.5 of concentrated sulfuric acid were placed in a three-necked flask. Then, 6.6 g of acetic anhydride was added dropwise thereto, and the mixture was heated to 80° C. and reacted for 2 hours. After the completion of the reaction, the reaction mixture was cooled to room temperature, to which was added 450 ml of acetone, and then 37.4 g of 1,2-naphthoquinonediazide-5-sulfonyl chloride was dissolved therein. Then, a mixed solution of triethylamine/acetone (=14.1 g/90 ml) was gradually added dropwise thereto with stirring and the reaction was conducted at room temperature for 3 hours. After the completion of the reaction, the contents were dropwise added to a 1% hydrochloric acid aqueous solution and a precipitate formed was collected by filtration, washed and dried to obtain 1,2-naphthoquinonediazide-5-sulfonate of acetylated derivative of 2,3,4,3′,4′,5′-hexahydroxybenzophenone. As the result of NMR measurement of the light-sensitive compounds thus obtained, it was found that acetyl groups were introduced in an average amount of 1.7 per molecule.

(3) Synthesis of Light-Sensitive Compound (c)

200 ml of distilled water and 4.3 g of sodium hydroxide were placed in a three-necked flask, and 10 g of 2,3,4,3′,4′,5′-hexahydroxybenzophenone was added thereto with stirring to form a uniform solution. Then, 13.5 g of ethylenebromohydrin was added dropwise thereto, the temperature of the mixture was raised and the reaction was conducted at 95° to 100° C. for hours After the completion of the reaction, the reaction mixture was cooled to room temperature, the pH of the system was adjusted to 3.0 with 36% hydrochloric acid, and the mixture was further stirred at 40° C. for 1 hour. The reaction mixture was extracted with 800 ml of ethyl acetate and ethyl acetate was removed by distillation to obtain the product. As the result of NMR measurement of the product thus obtained, it was found that hydroxyethyl groups were introduced in an average amount of 2.1 per molecule of the product.

15 g of the product obtained by the above described reaction, 40.1 g of 1,2-naphthoquinonediazide-5-sulfonyl chloride, and 350 ml of acetone were placed in a three-necked flask and stirred to dissolve these materials uniformly. Then, a mixed solution of triethylamine/acetone (=15.1 g/80 ml) was gradually added dropwise thereto and the reaction was conducted at room temperature for 3 hours. After the completion of the reaction, the contents were dropwise added to 1% hydrochloric acid aqueous solution and a precipitate formed was collected by filtration, washed and dried to obtain 1,2-naphthoquinone-diazide-5-sulfonate of hydroxyethylated derivative of 2,3,4,3′,4′,5′-hexahydroxybenzophenone.

(4) Synthesis of Light-Sensitive Compound (d)

20 g of 2,3,4,3′,4′,5′-hexahydroxybenzophenone, 23.8 of potassium carbonate and 160 ml of dimethyl-formamide were placed in a three-necked flask. 26.6 g of diethyl sulfate was added dropwise thereto with stirring at room temperature, and the mixture was heated to 75° C. and reacted for 1 hour. After the completion of the reaction, the reaction mixture was poured into 800 ml of distilled water, the pH of the system was adjusted to 3.0 with 46% hydrochloric acid, and the mixture was stirred at 40° C. for 1 hour. The precipitate was collected by filtration, washed with distilled water and dried under a vacuum. As the result of NMR measurement of the product thus obtained, it was found that ethyl groups were introduced in an average amount of 1.8 per molecule of 2,3,4,3′,4′,5′-hexahydroxybenzophenone.

28 g of the product obtained by the above described reaction, 77.1 g of 1,2-naphthoquinonediazide-5-sulfonyl chloride, and 650 ml of acetone were placed in a three-necked flask, and stirred to dissolve these materials uniformly. Then, a mixed solution of triethylamine/acetone (=29 g/130 ml) was gradually added dropwise thereto and the reaction was conducted for 3 hours at room temperature. After completion of the reaction, the contents were dropwise added to a 1% hydrochloric acid aqueous solution to obtain 1,2-naphthoquinonediazide-5-sulfonate of ethylated derivative of 2,3,4,3′,4′,5′-hexahydroxybenzophenone.

(5) Synthesis of Novolak Resin (i)

50 g of m-cresol, 50 g of p-cresol, 54.0 g of a 37% formaldehyde aqueous solution and 0.05 g of oxalic acid were placed in a three necked flask, and the temperature of the mixture was raised to 100° C. with stirring. The mixture was allowed to react for 10 hours. After the completion of the reaction, the reaction mixture was cooled to room temperature, then the pressure was reduced to a pressure of 30 mmHg. Then, the mixture was gradually heated to 150° C. to remove water and unreacted monomer. The resulting novolak resin had an average molecular weight of 13,000 (calculated as polystyrene).

(6) Synthesis of Novolak Resin (ii)

40 g of m-cresol, 60 g of p-cresol, 46.3 g of a 37% formaldehyde aqueous solution and 0.14 g of oxalic acid were placed in a three-necked flask, and the temperature of the mixture was raised to 100° C. with stirring. The mixture was allowed to react for 10 hours. After the completion of the reaction, the reaction mixture was cooled to room temperature, then the pressure was reduced to a pressure of 30 mmHg. Then, the mixture was gradually heated to 150° C. to remove water and unreacted monomer. The resulting novolak resin had an average molecular weight of 7,000 (calculated as polystyrene).

(7) Preparation and Evaluation of Positive Photoresist Composition 1.30 g of one of Light-Sensitive Compounds (a), (b) and (c) obtained in (1), (2) and (3) above and shown in the following Table 1, and 5 g of the cresol Novolak Resin (i) (molecular weight=13,000) obtained in (5)

above, were dissolved in 15 g of ethyl Cellosolve acetate. Further, 1.30 g of Light-Sensitive Compound (d) obtained in (4) above and 5 g of the cresol Novolak Resin (ii) (molecular weight=7,000) obtained in (6) above, were dissolved in 15 g of ethyl Cellosolve acetate in the same manner. The composition was filtered through a 0.2-μm microfilter to prepare a photoresist composition. This photoresist composition was coated on a silicon wafer using a spinner, and dried in a convection oven under a nitrogen atmosphere at 90° C. for 30 minutes to obtain a 1 5-μm thick resist coat. This coat was exposed using a reduction-projecting exposure apparatus, then developed for 1 minute using a 2.38% aqueous solution of tetramethylammonium hydroxide, washed with water for 30 seconds then dried.

The thus obtained resist pattern on the silicon wafer was observed under a scanning type electron microscope to evaluate the resist. The results thus-obtained are tabulated in Table 2 below.

Speed was defined as the reciprocal of the exposure amount necessary for reproducing a 2.0-μm mask pattern, and is shown as a relative value taking the speed of Comparative Example 1 as 1.0.

The "coat-remaining ratio" was evaluated as the ratio of the coat in the unexposed areas after development to that before development in terms of percentage in thickness.

Resolution is defined with the maximum feature of the resist image obtained upon the exposure which gives 1 to 1 reproduction of 2.0-μm mask pattern.

Heat resistance was presented as the temperature at which a resist pattern formed on a silicon wafer was deformed after baking for 30 minutes in a convection oven. (θ) made by the resist wall with the plane of the silicon wafer in the cross section of a 1.0-μm resist pattern.

As in seen from the results shown in Table 2, all of the positive photoresist compositions of the present invention exhibited excellent resolving power, resist profile, speed, and heat resistance. These positive-working photoresist compositions of the present invention formed no precipitates in the resist solution even after being left at 40° C. for 50 days.

observed in the resist solutions after storage for 50 days at 40° C.

TABLE 1

| | Light-Sensitive Compound | Esterification Ratio(*1) (%) | Remark |
|---|---|---|---|
| (a) | 1,2-Naphthoquinonediazide-5-sulfonate of 2,3,4,3',4',5'-hexahydroxybenzophenone derivative (introduced average of 2.3 ethyl groups per molecule) | 97 | Present Invention |
| (b) | 1,2-Naphthoquinonediazide-5-sulfonate of 2,3,4,3',4',5'-hexahydroxybenzophenone derivative (introduced average of 1.7 acetyl groups per molecule) | 90 | '' |
| (c) | 1,2-Naphthoquinonediazide-5-sulfonate of 2,3,4,3',4',5'-hexahydroxybenzophenone derivative (introduced average of 2.1 hydroxyethyl groups per molecule) | 95 | '' |
| (d) | 1,2-Naphthoquinonediazide-5-sulfonate of 2,3,4,3',4',5'-hexahydroxybenzophenone derivative (introduced average of 1.8 ethyl groups per molecule) | 80 | '' |
| (e) | 1,2-Naphthoquinonediazide-5-sulfonate of 2,3,4-trihydroxybenzophenone | 83 | Comparison |
| (f) | 1,2-Naphthoquinonediazide-5-sulfonate of 2,3,4,4'-tetrahydroxybenzophenone | 75 | '' |
| (g) | 1,2-Naphthoquinonediazide-5-sulfonate of 2,3,4,3',4',5'-hexahydroxybenzophenone | 67 | '' |

(*1) Esterification Ratio (%) =

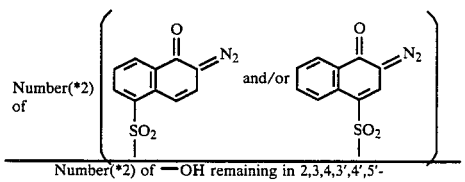

Number(*2) of —OH remaining in 2,3,4,3',4',5'-hexahydroxybenzophenone derivative
(*2) Number in terms of average value per molecule

TABLE 2

| Example No. | Light Sensitive Compound | Relative Sensitivity | Coat-Remaining Ratio (%) | Resolving Power (μm) | Heat Resistance (°C.) | Resist Form (θ) |
|---|---|---|---|---|---|---|
| Example 1 | (a) | 1.4 | 100 | 0.6 | 160 | 89 |
| Example 2 | (b) | 1.6 | 100 | 0.6 | 160 | 88 |
| Example 3 | (c) | 1.3 | 100 | 0.6 | 160 | 88 |
| Example 4 | (d) | 1.7 | 99 | 0.6 | 150 | 86 |
| Comparative Example 1 | (e) | 1.0 | 98 | 0.8 | 140 | 83 |
| Comparative Example 2 | (f) | 1.1 | 98 | 0.8 | 140 | 82 |
| Comparative Example 3 | (g) | 1.4 | 100 | 0.7 | 150 | 86 |

COMPARATIVE EXAMPLES 1 to 3

1.30 g of one of Light-Sensitive Compounds (e), (f) and (g) described in the following Table 1, and 5 g of cresol Novolak Resin (i) used in the above-described Examples were dissolved in 15 g of ethyl Cellosolve acetate, and resists were formed and evaluated in the same manner as described above in Examples 1 to 4. The results thus obtained are shown in Table 2 below. In Comparative Examples 1, 2 and 3, precipitates were While the invention has been described in detail and with reference to specific embodiments thereof, it will be apparent to one skilled in the art that various changes and modifications can be made therein without departing from the spirit and scope thereof.

What is claimed is:

1. A positive-working photoresist composition comprising a light-sensitive compound represented by general formula (A) and an alkali-soluble novolak resin

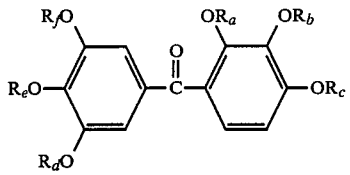 (A)

wherein $R_a$, $R_b$, $R_c$, $R_d$, $R_e$ and $R_f$, which may be the same or different, each represents H, —X—$R_1$,

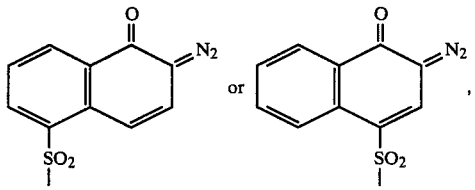

provided that among the six substituents represented by $R_a$ to $R_f$, the number of said substituents representing H is a real number of more than 0 and not more than 3 calculated in terms of average value per molecule of said light-sensitive compound, the number of said substituents representing —X—$R_1$ is a real number of not less than 0.3 calculated in terms of average value per molecule of said light-sensitive compound, and the number of said substituents representing

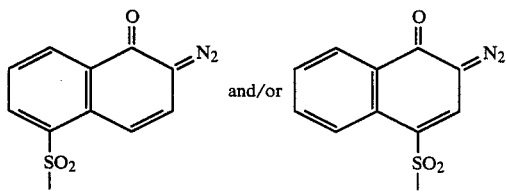

is a real number of not less than 2.5 calculated in terms of average value per molecule of said light-sensitive compound; X represents a simple bond,

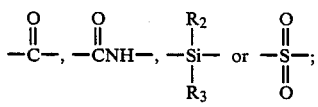

$R_1$ represents a substituted or unsubstituted aliphatic group or a substituted or unsubstituted aromatic group; and $R_2$ and $R_3$, which may be the same or different, each represents H or a substituted or unsubstituted aliphatic group or a substituted or unsubstituted aromatic group.

2. A positive-working photoresist composition as claimed in claim 1, wherein said substituents are present in said light-sensitive compound in amounts as represented by the real numbers calculated in terms of average value per molecule as follows:

$$0 < (H) \leq 3$$
$$0.3 \leq (-X-R_1) < 3.5$$

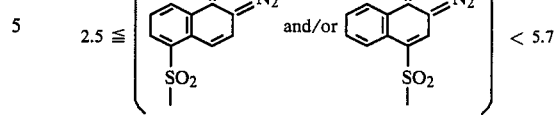

3. A positive-working photoresist composition as claimed in claim 1, wherein the group —X—$R_1$ in general formula (A) is a substituted or unsubstituted aliphatic group, a substituted or unsubstituted aromatic group, an acyl group represented by

(wherein $R_{11}$ represents a substituted or unsubstituted aliphatic group or a substituted or unsubstituted aromatic group), a silyl group represented by

(wherein $R_{12}$ and $R_{13}$, which may be the same or different, each represents a hydrogen atom, a substituted or unsubstituted aliphatic group or a substituted or unsubstituted aromatic group; and $R_{14}$ represents a substituted or unsubstituted aliphatic group or a substituted or unsubstituted aromatic group), a sulfonyl group represented by —$SO_2$—$R_{15}$ (wherein $R_{15}$ represents a substituted or unsubstituted aliphatic group or a substituted or unsubstituted aromatic group), or an amido group represented by

(wherein $R_{16}$ represents a substituted or unsubstituted aliphatic group or a substituted or unsubstituted aromatic group).

4. A positive-working photoresist composition as claimed in claim 3, wherein the aliphatic group is an alkyl group or an alkenyl group, and the aromatic group is a phenyl group or a naphthyl group.

5. A positive-working photoresist composition as claimed in claim 3, wherein the substituted aliphatic group may be substituted by an alkoxy group, an aryloxy group, an aryl group, a hydroxy group, a carboxy group, a sulfo group, an amino group, a nitro group, a silyl group, a silyl ether group, a cyano group, an aldehyde group, a mercapto group, and a halogen atom.

6. A positive-working photoresist composition as claimed in claim 3, wherein the substituted aromatic group may be substituted by an aliphatic group, an alkoxy group, an aryloxy group, an aryl group, a hydroxy group, a carboxy group, a sulfo group, an amino group, a nitro group, a silyl group, a silyl ether group, a cyano group, an aldehyde group, a mercapto group, and a halogen atom.

7. A positive-working photoresist composition as claimed in claim 1, wherein $R_1$ is a substituted or unsubstituted aliphatic group having from 1 to 8 carbon atoms or a substituted or unsubstituted aromatic group having from 6 to 15 carbon atoms.

8. A positive-working photoresist composition as claimed in claim 1, wherein the alkali-soluble novolak resin is an acid catalyzed addition condensation product of a phenol with about 0.6 to about 1.0 mol of an aldehyde per mol of the phenol.

9. A positive-working photoresist composition as claimed in claim 8, wherein the phenol is a mixture of two or more phenols selected from phenol, o-cresol, m-cresol, p-cresol and xylenol.

10. A positive-working photoresist composition as claimed in claim 1, wherein the alkali-soluble novolak resin has a molecular weight of about 1,000 to about 50,000.

11. A positive-working photoresist composition as claimed in claim 1, wherein the light-sensitive compound is present in an amount of from about 5 to about 100 parts by weight per 100 parts by weight of the alkali-soluble novolak resin.

12. A positive-working photoresist composition as claimed in claim 1, wherein the positive-working photoresist composition is dissolved in an organic solvent.

* * * * *